(12) United States Patent
Liu et al.

(10) Patent No.: US 12,527,044 B2
(45) Date of Patent: Jan. 13, 2026

(54) SUPER JUNCTION SEMICONDUCTOR POWER DEVICE

(71) Applicant: SUZHOU ORIENTAL SEMICONDUCTOR CO., LTD., Jiangsu (CN)

(72) Inventors: Lei Liu, Jiangsu (CN); Wei Liu, Jiangsu (CN); Yuanlin Yuan, Jiangsu (CN); Rui Wang, Suzhou (CN)

(73) Assignee: SUZHOU ORIENTAL SEMICONDUCTOR CO., LTD., Jiangsu (CN)

( * ) Notice: Subject to any disclaimer, the term of this patent is extended or adjusted under 35 U.S.C. 154(b) by 422 days.

(21) Appl. No.: 18/017,821

(22) PCT Filed: Jun. 10, 2022

(86) PCT No.: PCT/CN2022/098111
§ 371 (c)(1),
(2) Date: Jan. 24, 2023

(87) PCT Pub. No.: WO2023/045414
PCT Pub. Date: Mar. 30, 2023

(65) Prior Publication Data
US 2024/0250118 A1  Jul. 25, 2024

(30) Foreign Application Priority Data
Sep. 26, 2021 (CN) .......................... 202111128640.7

(51) Int. Cl.
*H10D 62/10* (2025.01)
*H10D 30/66* (2025.01)

(52) U.S. Cl.
CPC ......... *H10D 62/111* (2025.01); *H10D 30/668* (2025.01)

(58) Field of Classification Search
CPC .. H10D 62/111; H10D 62/393; H10D 62/109; H10D 12/441; H10D 30/60;
(Continued)

(56) References Cited

U.S. PATENT DOCUMENTS

| 6,060,747 A | 5/2000 | Okumura |
| 6,445,036 B1 | 9/2002 | Maruoka |

(Continued)

FOREIGN PATENT DOCUMENTS

| CN | 107464837 A | 12/2017 |
| CN | 207183281 U | 4/2018 |

(Continued)

OTHER PUBLICATIONS

PCT/CN2022/098111 International Search Report dated Aug. 26, 2022.

*Primary Examiner* — Christine S. Kim
*Assistant Examiner* — Cole Leon Lindsey
(74) *Attorney, Agent, or Firm* — Michael Best & Friedrich LLP

(57) ABSTRACT

A super junction semiconductor power device includes an n-type drain region, an n-type drift region, multiple p-type columns, and two gate trenches. The n-type drift region is located on the n-type drain region. The multiple p-type columns have the same width. The spacing between two adjacent p-type columns is the same. A first p-type body region is disposed on the top of each p-type column. The first p-type body region is provided with a first n-type source region. Two gate trenches are between two adjacent first p-type body regions. The spacing between the two gate trenches has at least two different spacing values. The widths of the two gate trenches between the two adjacent first p-type body regions are the same. Each gate trench is provided with a gate dielectric layer and a gate.

4 Claims, 1 Drawing Sheet

(58) Field of Classification Search
CPC .. H10D 64/117; H10D 64/111; H10D 12/031; H10D 30/63; H10D 30/025; H10D 30/021; H10D 12/038
See application file for complete search history.

(56) References Cited

U.S. PATENT DOCUMENTS

2016/0035825 A1* 2/2016 Jun ...................... H10D 62/111
 438/268
2016/0035882 A1* 2/2016 Vielemeyer .......... H10D 84/141
 257/330

FOREIGN PATENT DOCUMENTS

| | | | | |
|---|---|---|---|---|
| CN | 108899370 A | | 11/2018 | |
| CN | 110416309 A | | 11/2019 | |
| CN | 107464837 B | * | 7/2020 | ........... H10D 62/111 |
| JP | 2011-035410 A | | 2/2011 | |
| WO | 2014174911 A1 | | 10/2014 | |

* cited by examiner

SUPER JUNCTION SEMICONDUCTOR POWER DEVICE

CROSS-REFERENCE TO RELATED APPLICATION(S)

This is a national stage application filed under 37 U.S.C. 371 based on International Patent Application No. PCT/CN2022/098111, filed Jun. 10, 2022, which claims priority to Chinese Patent Application No. 202111128640.7 filed with the China National Intellectual Property Administration (CNIPA) on Sep. 26, 2021, the disclosures of which are incorporated herein by reference in their entireties.

TECHNICAL FIELD

The present application belongs to the field of semiconductor power device technology, for example, relates to a super junction semiconductor power device.

BACKGROUND

Based on charge balance technology, super junction semiconductor power devices can reduce on-state resistance and parasitic capacitance. The super junction semiconductor power devices have extremely fast switching characteristics. In this manner, switching loss can be reduced, and higher power conversion efficiency can be implemented. During the turn-on and turn-off process of a super junction semiconductor power device, Miller capacitance (Crss) and the gate-drain capacitance (Cgd) corresponding thereto play an important role in the switching process of the super junction semiconductor power device. When a super junction semiconductor power device is turned on and off, gate-drain capacitance (Cgd) may change suddenly. As a result, the electrical property of the super junction semiconductor power device also changes suddenly.

SUMMARY

The present application provides a super junction semiconductor power device that can adjust a variation curve of gate-drain capacitance to solve the problem of a sudden change in the gate-drain capacitance of the super junction semiconductor power device in the related art.

An embodiment of the present application provides a super junction semiconductor power device. The super junction semiconductor power device includes an n-type drain region, an n-type drift region, multiple p-type columns, and two gate trenches between two adjacent first p-type body regions.

The n-type drift region is located on the n-type drain region.

The multiple p-type columns have the same width. The spacing between two adjacent p-type columns is the same.

A first p-type body region is disposed on the top of each p-type column. The first p-type body region is provided with a first n-type source region.

The spacing between the two gate trenches has at least two different spacing values.

The widths of the two gate trenches between the two adjacent first p-type body regions are the same. Each gate trench is provided with a gate dielectric layer and a gate.

DETAILED DESCRIPTION

The solution of the present application is completely described hereinafter through specific implementations in conjunction with the drawings in embodiments of the present application.

Figure 1:
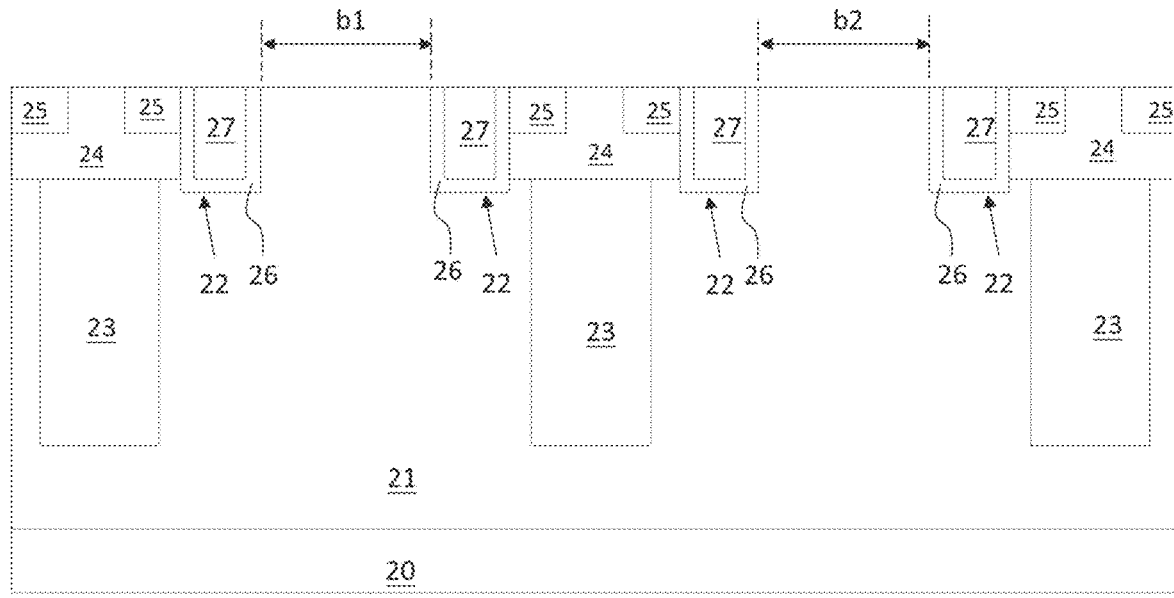
FIG. 1 is a sectional view of an embodiment of a super junction semiconductor power device according to the present application.

FIG. 1 is a sectional view of an embodiment of a super junction semiconductor power device according to the present application. As shown in FIG. 1, an embodiment of the present application provides a super junction semiconductor power device. The super junction semiconductor power device includes an n-type drain region 20 and an n-type drift region 21. The n-type drain region 20 may be externally connected to a drain voltage through a metal layer. The n-type drift region 21 is located on the n-type drain region 20.

The super junction semiconductor power device provided in the present application also includes multiple p-type columns 23. The widths of the multiple p-type columns 23 are the same. The spacing between two adjacent p-type columns 23 is the same. A p-type column 23 and the adjacent n-type drift region 21 form a charge-balanced pn junction structure. For ease of illustration and description, only three p-type columns 23 are exemplarily shown in FIG. 1.

A first p-type body region 24 is disposed at the top of each p-type column 23. The first p-type body region 24 is provided with a first n-type source region 25.

The super junction semiconductor power device provided in the present application includes two gate trenches 22 between two adjacent first p-type body regions 24. The spacing between the two gate trenches 22 has at least two different spacing values. In this embodiment of the present application, it is exemplarily shown that the spacing between gate trenches 22 has two different spacing values, b1 and b2 (b1≠b2). When a source-drain voltage makes the region between gate trenches 22 completely depleted, gate-drain capacitance may suddenly drop at this voltage point. The spacing between the gate trenches 22 is set to have at least two different spacing values. The region with a small spacing between the gate trenches 22 is first depleted. The gate-drain capacitance may suddenly drop at this source-drain voltage point. Then, as the source-drain voltage rises further, the regions with slightly wider spacing between the gate trenches 22 are sequentially depleted. The gate-drain capacitance may suddenly drop at these source-drain voltage points in sequence. In this manner, the sudden change point of the gate-drain capacitance is divided into several different source-drain voltage points, and the sudden change speed of the gate-drain capacitance is reduced, thereby reducing the gate voltage oscillation caused by the sudden change of the gate-drain capacitance.

The spacing between two gate trenches 22 may be understood as the spacing between two gate trenches 22 between two adjacent p-type columns 23, rather than the spacing between two gate trenches 22 on two sides of the same p-type column 23.

The widths of two gate trenches 22 between two adjacent first p-type body regions (24) are the same. A gate trench 22 is provided with a gate dielectric layer 26 and a gate 27. The gate 27 generally controls a first current channel of a first p-type body region 24 to turn on and turn off by being externally connected to a gate voltage.

In the super junction semiconductor power device of the present application, a double-trench gate structure is used between first p-type body regions 24. The variation curve of the gate-drain capacitance is adjusted by adjustment of the spacing between gate trenches. In this manner, when the super junction semiconductor power device is turned on and off, the sudden change of the gate-drain capacitance is slowed down.

Figure 2:
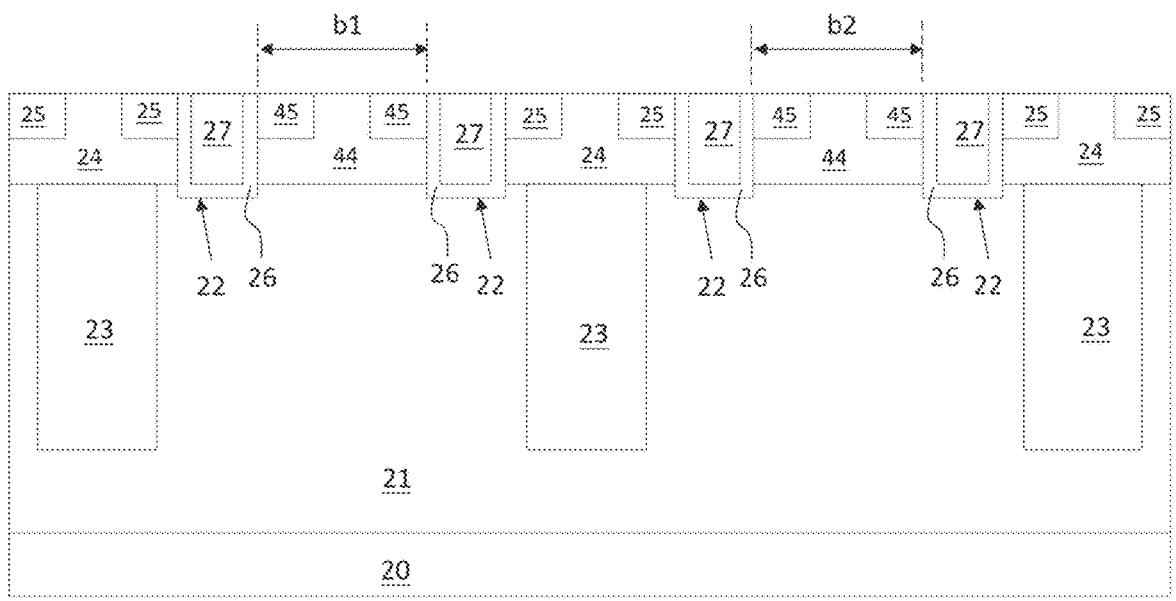
FIG. 2 is a sectional view of another embodiment of a super junction semiconductor power device according to the present application.

FIG. 2 is a sectional view of another embodiment of a super junction semiconductor power device according to the present application. In comparison with the embodiment shown in FIG. 1, the super junction semiconductor power device according to the present application shown in FIG. 2 also includes a second p-type body region 44. The second p-type body region 44 is disposed between two gate trenches 22 and on an n-type drift region 21. At this time, the width of the second p-type body region 44 has at least two different width values. Corresponding to FIG. 1, the width of the second p-type body region 44 in FIG. 2 has two different width values, b1 and b2 (b1≠b2). The second p-type body region 44 is provided with a second n-type source region 45. At this time, a gate 27 may also control a second current channel of the second p-type body region 44 to turn on and turn off at the same time through a gate voltage. At this time, the number of current channels in the super junction semiconductor power device is increased, thereby reducing the on-state resistance of the super junction semiconductor power device.

In the super junction semiconductor power device of the present application, the thickness of the gate dielectric layer 26 at the bottom of each gate trench 22 is greater than the thickness of the gate dielectric layer 26 at the sidewall of each gate trench 22. In this manner, the value of the gate-drain capacitance can be reduced, and the degree of the sudden change of the gate-drain capacitance can be reduced.

What is claimed is:

1. A super junction semiconductor power device, comprising:
   an n-type drain region; an n-type drift region located on the n-type drain region;
   a plurality of p-type columns of a same width, wherein a spacing between two adjacent p-type columns of the plurality of p-type columns is the same; and
   a first p-type body region is disposed on a top of each p-type column of the plurality of p-type columns, and the first p-type body region is provided with a first n-type source region; and
   two gate trenches between two adjacent first p-type body regions, wherein a spacing between the two gate trenches has at least two different spacing values; and
   widths of the two gate trenches between the two adjacent first p-type body regions are the same, and each gate trench of the two gate trenches is provided with a gate dielectric layer and a gate.

2. The super junction semiconductor power device according to claim 1, further comprising a second p-type body region between the two gate trenches, wherein the second p-type body region is provided with a second n-type source region, and a width of the second p-type body region has at least two different width values.

3. The super junction semiconductor power device according to claim 1, wherein thickness of the gate dielectric layer at a bottom of each gate trench is greater than thickness of the gate dielectric layer at a sidewall of each gate trench.

4. The super junction semiconductor power device according to claim 1, wherein widths of two adjacent first p-type body regions are the same, and a width of each of two gate trenches between certain two adjacent first p-type body regions is different from a width of each of two gate trenches between another two adjacent first p-type body regions.

* * * * *